United States Patent
Uchida

(10) Patent No.: US 6,620,649 B2
(45) Date of Patent: Sep. 16, 2003

(54) METHOD FOR SELECTIVELY PROVIDING ADHESIVE ON A SEMICONDUCTOR DEVICE

(75) Inventor: Yasufumi Uchida, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/956,122

(22) Filed: Sep. 20, 2001

(65) Prior Publication Data
US 2002/0155638 A1 Oct. 24, 2002

(30) Foreign Application Priority Data

Apr. 24, 2001 (JP) ........................................ 2001/125368

(51) Int. Cl.$^7$ .................... H01L 21/44; H01L 21/48; H01L 21/50
(52) U.S. Cl. .................... 438/107; 438/113; 438/460; 438/976
(58) Field of Search ................ 438/460, 976, 438/33, 113, 114, 465, 107

(56) References Cited

U.S. PATENT DOCUMENTS

| | | | | |
|---|---|---|---|---|
| 5,258,325 A | * | 11/1993 | Spitzer et al. | 438/107 |
| 5,776,799 A | * | 7/1998 | Song et al. | 438/118 |
| 5,824,177 A | * | 10/1998 | Yoshihara et al. | 156/250 |
| 5,863,815 A | | 1/1999 | Egawa | |
| 5,981,360 A | * | 11/1999 | Rabarot et al. | 438/455 |
| 5,994,168 A | | 11/1999 | Egawa | |
| 6,184,109 B1 | * | 2/2001 | Sasaki et al. | 438/113 |
| 6,319,745 B1 | * | 11/2001 | Bertin et al. | 438/60 |
| 6,322,903 B1 | * | 11/2001 | Siniaguine et al. | 428/617 |
| 6,344,401 B1 | * | 2/2002 | Lam | 257/678 |
| 2002/0037631 A1 | * | 3/2002 | Mimata | 438/460 |
| 2002/0048906 A1 | * | 4/2002 | Sakai et al. | 438/464 |

FOREIGN PATENT DOCUMENTS

| | | |
|---|---|---|
| JP | 06104311 A | 4/1994 |
| JP | 09097815 A | 4/1997 |
| JP | 09252025 A | 9/1997 |
| JP | 11340278 A | 12/1999 |

* cited by examiner

Primary Examiner—John F. Niebling
Assistant Examiner—Angel Roman
(74) Attorney, Agent, or Firm—Volentine Francos, PLLC

(57) ABSTRACT

In a method of fabricating a semiconductor device, a semiconductor wafer is provided with a plurality of semiconductor elements formed thereon. An insulating adhesive is selectively provided over respective predetermined areas of the semiconductor elements. The semiconductor wafer is then separated into the semiconductor elements, each having corresponding portions of the insulating adhesive thereon.

16 Claims, 12 Drawing Sheets

METHOD FOR SELECTIVELY PROVIDING ADHESIVE ON A SEMICONDUCTOR DEVICE

BACKGROUND OF THE INVENTION

1. Field of the Invention

The present invention relates to a method for fabricating a semiconductor device, and particularly to a method for manufacturing a semiconductor device using a flip chip type semiconductor chip (also called a "semiconductor element").

This application is counterpart of Japanese Patent Applications, Serial Number 125368/2001, filed May 10, 2001, the subject matter of which is incorporated herein by reference.

2. Description of the Related Art

FIGS. 11(a)–11(d) are diagrams for describing a conventional process for manufacturing or fabricating a semiconductor device. First of all, FIG. 11(a) shows a semiconductor chip 1 corresponding to each of chips diced from a semiconductor wafer. An AL (aluminum) electrode pad is provided over the surface of the semiconductor chip 1, and metal bumps 2 are formed over the pad. Next, as shown in FIG. 11(b), the semiconductor chip 1 is flipped (turned upside down) to thereby bond the metal bumps 2 to a metal electrode placed over a mother board (circuit substrate) 3 by heating. Next, as shown in FIG. 11(c), a liquid sealing or encapsulating resin 5 charged into a cylinder 4 drops onto one side of the semiconductor chip 1. At this time, the encapsulating resin 5 is absorbed into a space or gap defined between the semiconductor chip 1 and the mother board 3 by a capillary phenomenon. The encapsulating resin 5 flows into the space toward the other side of the semiconductor chip 1. As a result, the encapsulating resin 5 is charged into the space as shown in FIG. 11(d). Thereafter, the encapsulating resin 5 is cured by heating. Thus, the space is sealed so that the semiconductor chip 1 and the mother board 3 are bonded to each other.

In the conventional process show in FIGS. 11(a)–11(d), however, when a distance t1 (see FIGS. 11(c) and 12(a)) provided between the semiconductor chip 1 and the mother board 3 is short, a shear frictional force (corresponding to a frictional force produced between the surface of the semiconductor chip 1 and that of the mother board 3) of the encapsulating resin 5 surpass a sucking force developed by the semiconductor chip 1 and the mother board 3 and hence an uncharged portion 6 occurs. A problem arises in that when the unfilled portion 6 is formed, the surface of the semiconductor chip 1 cannot sufficiently be protected from an outer atmosphere. It is thus not possible to simply shorten the distance t1 between the semiconductor chip 1 and the mother board 3. As a result, it was difficult to reduce the thickness of the semiconductor device.

Each of Japanese Patent Application Laid-Open (Unexamined Patent Publications) Nos. Hei 11(1999)-340278, Hei 10(1998)-242208, Hei 9(1997)-97815, Hei 6(1994)-104311 and the like has disclosed the technology of firstly bonding an insulating or insulative adhesive film (insulative sealing or encapsulating resin sheet) onto the surface of a semiconductor chip when the semiconductor chip is placed over a mother board and next melting and curing the insulating adhesive film by heating.

Each of the above-described publications also describes the technology of firstly providing an insulating adhesive film within a gap defined between a semiconductor chip and a mother board when the semiconductor chip is placed over the mother board and next melting and curing the insulating adhesive film by heating. According to these technologies, the overall gap defined between the semiconductor chip and the mother board can be filled with an insulating resin.

In the conventional process using the insulating adhesive film, however, the insulating adhesive film is provided for each semiconductor chip. This means that the semiconductor device fabricating process gets longer in time. Further, the execution of a process step for providing the insulating adhesive film for each semiconductor chip or a process step for providing the insulating adhesive film between each semiconductor chip and the mother board means that the semiconductor device manufacturing process become long in time. As a result, the manufacturing cost of the semiconductor device increases.

SUMMARY OF THE INVENTION

An object of the present invention is to provide a method for fabricating a semiconductor device, which is capable of reducing production yields with a view toward solving the above-described conventional problems.

Another object of the present invention is to provide a method of fabricating a semiconductor device, which is capable of reducing a manufacturing process time. A further object of the present invention is to provide a method for manufacturing a semiconductor device, which is capable of reducing a manufacturing cost.

The present invention has been made to achieve the above objects. A typical method for fabricating a semiconductor device, according to the present invention is as follows: The present method includes a step for preparing a semiconductor wafer with a plurality of semiconductor elements formed thereon, a step for selectively providing insulating adhesives over respective predetermined areas of the semiconductor elements, and a step for fractionizing the respective semiconductor elements.

The above and further objects and novel features of the invention will more fully appear from the following detailed description, appended claims and the accompanying drawings.

BRIEF DESCRIPTION OF THE DRAWINGS

The present invention will be described below with reference to the accompanying drawings in which.

DETAILED DESCRIPTION OF THE PREFERRED EMBODIMENTS

Preferred embodiments of the present invention will hereinafter be described in detail with reference to the accompanying drawings.

First Embodiment

Figure 1:
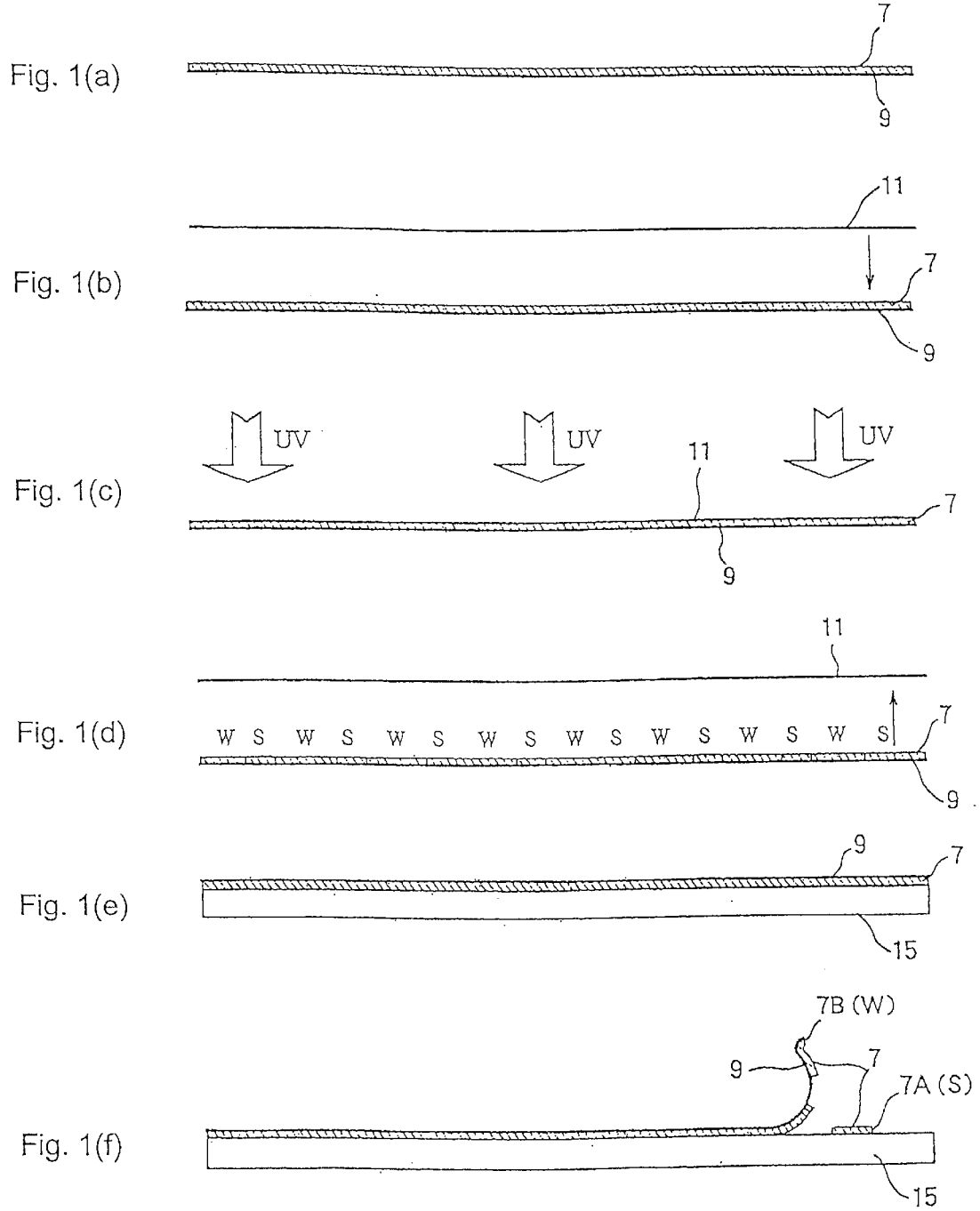
FIGS. 1(a) through 1(f) are respectively process diagrams showing a process for fabricating a semiconductor device, according to a first embodiment of the present invention.
Figure 2:
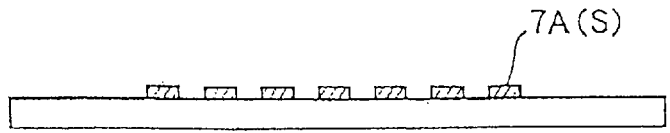
FIGS. 2(gA), 2(gB) and 2(h) are respectively process diagrams illustrating the process for fabricating the semiconductor device, according to the first embodiment of the present invention.
Figure 2:
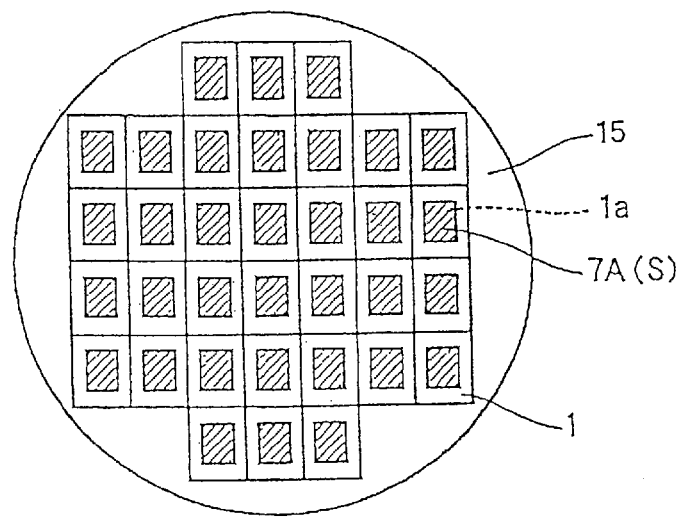

FIGS. 1(a)–1(f), and FIGS. 2(gA), 2(gB) and 2(h), are respectively process diagrams showing a process for fabricating a semiconductor device, according to a first embodiment of the present invention. Incidentally, FIGS. 2(gA) and 2(gB) are respectively diagrams showing the same process step. FIG. 2(gA) is a side view of the semiconductor device in this process step, and FIG. 2(gB) is a top view thereof, respectively.

As shown in FIG. 1(a), an insulative adhesive 7 is first supplied (applied) onto a separator 9 so that the thickness thereof becomes uniform. For instance, polyethylene terephthalate is used as the separator 9.

The insulative adhesive 7 used in the present embodiment contains a thermosetting component and an UV (UltraViolet) photo-curing component. The adhesive 7 is liquid before it is supplied (applied) and immediately after it is supplied (applied). After the adhesive 7 has been supplied (applied), it is subjected to room temperatures and thereby semi-solidified. The thermosetting component has the action of firstly melting the adhesive 7 by heating and curing the adhesive 7 by more continuous heating. Further, the UV photo-curing component has the action of curing the adhesive 7 by application of UV light (curing only the surface thereof irradiated with the UV light).

For instance, a die attach film (Model Number: 323E) produced by Lintec Corporation is used as the insulative adhesive 7. The die attach film 323E is one obtained by applying a photo-initiator (UV photo-curing component) to an epoxy resin (thermosetting component). Such an insulative adhesive is semi-solidified by being subjected to room temperatures after its application. When the insulative adhesive is heated, it is molten once under the action of the thermosetting component. Thereafter, when the insulative adhesive is further heated, it is cured under the action of the thermosetting component. When the UV light is applied to the semi-solidified insulative adhesive, the surface thereof irradiated with the UV light is cured under the action of the UV photo-curing component. The adhesive strength of the cured surface is lower than that of other portion.

Next, as shown in FIG. 1(b), an exposure mask 11 is placed over the insulative adhesive 7 applied onto the separator 7 and semi-solidified. Thereafter, as shown in FIG. 1(c), the insulative adhesive 7 is irradiated with the UV light through the exposure mask 11. Afterwards, the exposure mask 11 is removed from the insulative adhesive 7 as shown in FIG. 1(d).

Figure 3A:
FIGS. 3(a) and 3(b) are respectively structural diagrams of an exposure mask 11.
Figure 3B:
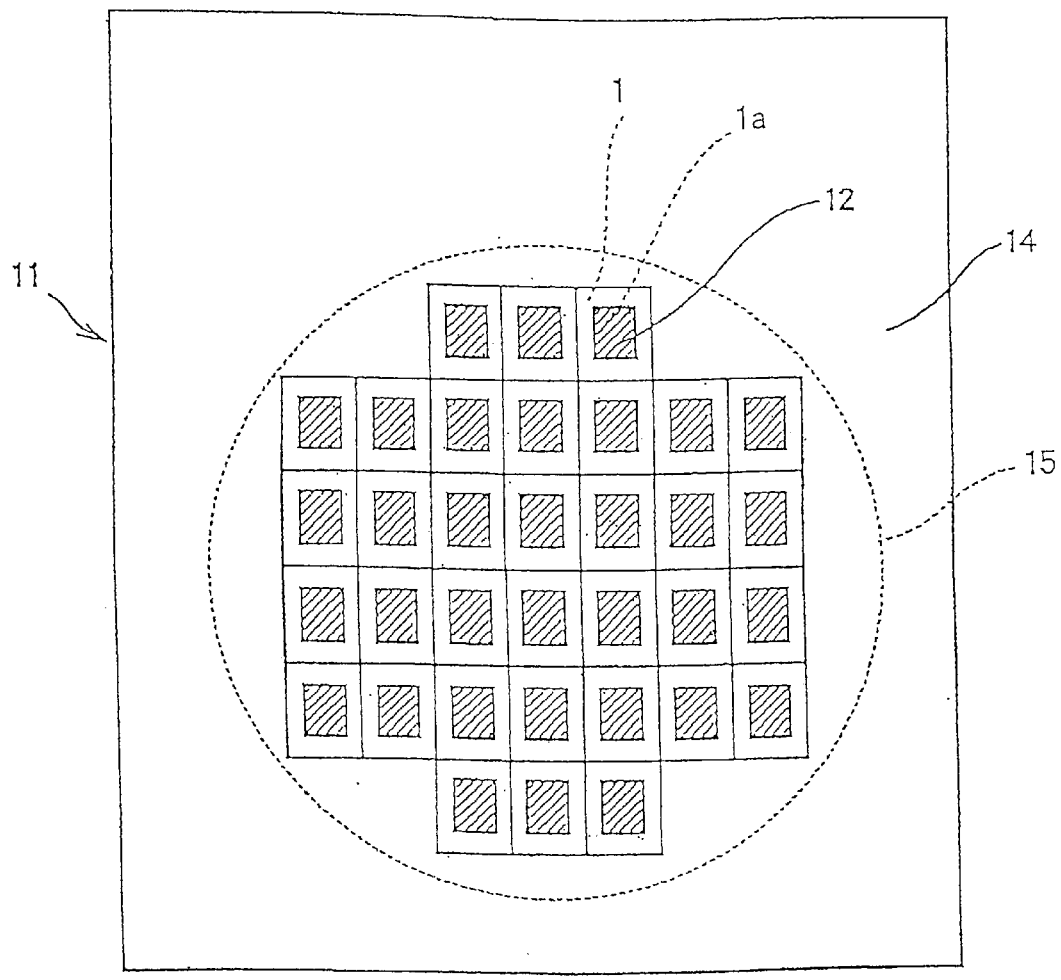

FIGS. 3(a) and 3(b) are diagrams showing the structure of the exposure mask 11 shown in FIGS. 1(a)–1(f), wherein FIG. 3(A) is a side view thereof and FIG. 3(B) is a top view thereof, respectively. As shown in FIGS. 3(a) and 3(b), the exposure mask 11 comprises a glass plate 14 and UV-light shielding or masking films 12 formed over the glass plate 14. The UV-light masking films 12 are formed in a plurality of mutually-separated areas placed over the glass plate 14. The UV light passes through the glass plate 14 corresponding to a portion where the UV-light masking films 12 are not provided, but is not capable of passing through the UV-light masking films 12. Therefore, the UV light is applied to only a surface area of the insulative adhesive 7, corresponding to the portion where the UV-light masking films 12 of the exposure mask 11 are not provided. The UV light is not applied to a surface area of the insulative adhesive 7, which is placed directly below each UV-light masking film 12. Incidentally, an area 1a over which each UV-light masking film 12 of the exposure mask 11 is provided, corresponds to a predetermined area (hereinafter called "adhesive forming predeterminate area") built in a semiconductor wafer 15 and intended for the provision of the insulative adhesive over each semiconductor element 1. An area over which the UV-light masking films 12 of the exposure mask 11 are not provided, corresponds to an area excluding the adhesive forming area placed over the surface of the semiconductor wafer 15.

Since the photo-curing component is cured by the UV light in the surface area of the insulative adhesive 7 directly below the non-provided portion of the UV-light masking films 12 after the process step of FIG. 1(c), the adhesive strength thereof becomes low. Since the surface area of the insulative adhesive 7 directly below the UV-light masking films 12 is not irradiated with the UV light, the photo-curing component is not cured and the adhesive strength thereof is maintained. Accordingly, the insulative adhesive 7 comprises portions W relatively low in adhesive strength and portions S relatively high in adhesive strength as shown in FIG. 1(d). Incidentally, each portion S of the insulative adhesive 7 corresponds to the adhesive forming area over the surface of the semiconductor wafer 15, whereas each portion W of the insulative adhesive 7 corresponds to the area other than the adhesive forming area over the surface of the semiconductor wafer 15.

Adhesive strengths among the separator 9, the insulative adhesive 7 and the semiconductor wafer 15 have the following relation. The adhesive strength between the portion W of the insulative adhesive 7 and the separator 9 is larger than that between the portion W and the semiconductor wafer 15 and smaller than that between the portion S of the insulative adhesive 7 and the semiconductor wafer 15.

As shown in FIG. 1(e), the surface of the insulative adhesive 7 provided over the separator 9 is laminated over the surface of the semiconductor wafer 15 whose back has already been ground (back-ground). At this time, the semiconductor wafer 15 and the separator 9 are aligned so that the portions S of the insulative adhesive 7 are bonded onto their corresponding adhesive forming areas over the surfaces of the semiconductor elements 1. As a result, only the portions S are bonded to their corresponding adhesive forming areas and the portions W are not bonded to the surface of the semiconductor wafer 15.

Next, as shown in FIG. 1(f), the separator 9 is peeled from the semiconductor wafer 15. The adhesive strength between the back of each portion S of the insulative adhesive 7 and the separator 9 is smaller than that between the surface of each portion S and the semiconductor wafer 15. Further, the adhesive strength between the back of each portion W of the insulative adhesive 7 and the separator 9 is larger than that between the surface of each portion W and the semiconductor wafer 15. Accordingly, when the separator 9 is peeled from the semiconductor 15, the portions W (insulative adhesives 7B) of the insulative adhesive 7 are simultaneously peeled from the semiconductor wafer 15 in a mass. On the other hand, the portions S (insulative adhesives 7A) of the insulative adhesive 7 are peeled collectively and simultaneously from the separator 9. Namely, the portions S are left in the adhesive forming areas respectively.

As shown in FIGS. 2(gA) and 2(gB), the semiconductor wafer 15 with the insulative adhesives 7A (corresponding to the portions S of the insulative adhesive 7) provided in their corresponding adhesive forming areas 1a of the surfaces of the respective semiconductor elements 1 is obtained according to the above process steps.

Figure 2H:
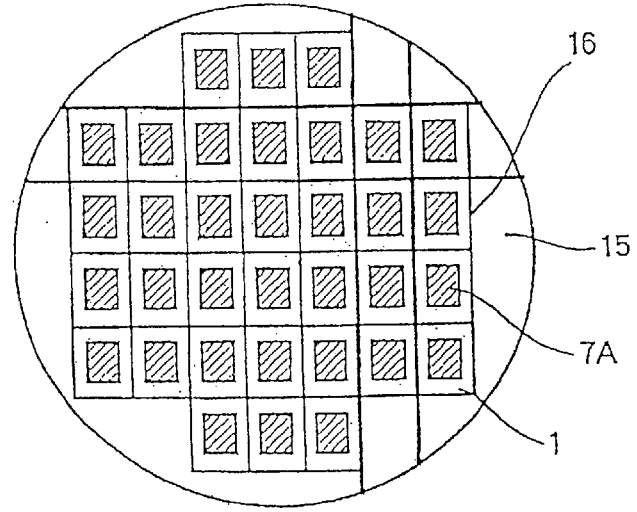

Thereafter, as shown in FIG. 2(h), the semiconductor wafer 15 is diced along scribe lines 16. Incidentally, heavy lines in FIG. 2(h) indicates that trenches or grooves are defined by a dicing saw. As a result, a semiconductor chip 1A (corresponding to a chip of each semiconductor element 1) with an insulative adhesive 7A provided within an adhesive forming area 1a is obtained as shown in FIGS. 4(aA) and 4(aB).

Figure 4:
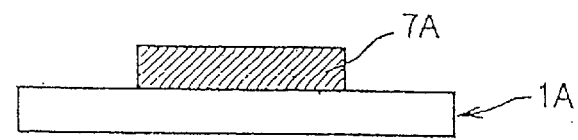
FIGS. 4(aA) through 4(d) are respectively process diagrams showing the process for fabricating the semiconductor device, according to the first embodiment of the present invention.
Figure 4:
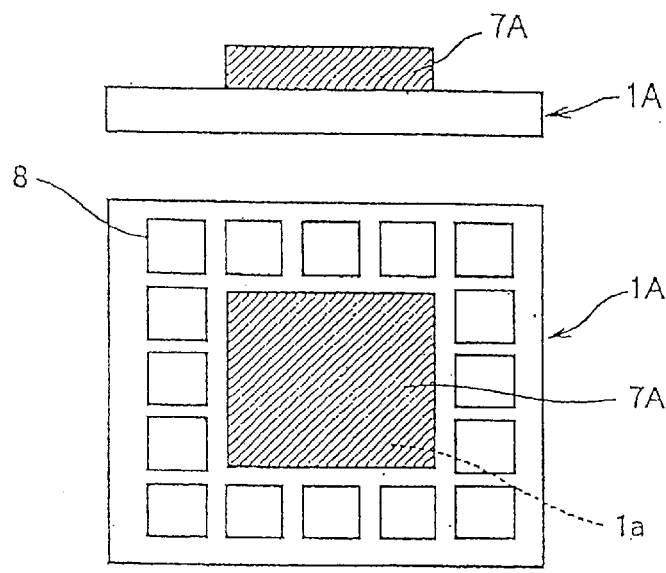

In the case of the semiconductor chip 1A with AL (aluminum) electrode pads 8 provided on the periphery thereof as shown in FIGS. 4(aA) and 4(aB), the position of the adhesive forming area 1a is defined by a central area 1a of the semiconductor chip 1A.

In the first embodiment as described above in details, the insulative adhesives 7A can collectively simultaneously be provided over the semiconductor wafer antecedent to its dicing. Namely, the insulative adhesives 7A can simultaneously be provided over their corresponding plural adhesive forming areas 1a of a plurality of semiconductor elements 1. Accordingly, the time required to perform the process step (corresponding to the step for providing the insulative adhesives 7A within the adhesive forming areas 1a of the semiconductor elements 1 in the first embodiment) for providing the insulative adhesives in the adhesive forming areas of the semiconductor chips can be shorter than ever. It is thus possible to reduce the manufacturing cost.

In the first embodiment as well, the plurality of insulative adhesives 7A are simultaneously formed over the plurality of semiconductor elements respectively. Namely, the plurality of insulative adhesives can collectively simultaneously be formed in semiconductor wafer units. This means that the process for manufacturing the semiconductor device can be shortened and the manufacturing cost can be reduced.

FIGS. 4(aA)–4(d) are diagrams for describing a process for flip-chip bonding a semiconductor chip with an insulative adhesive provided thereon onto a mother board (circuit substrate) in the process for fabricating the semiconductor device, according to the first embodiment of the present invention.

Figure 4B:
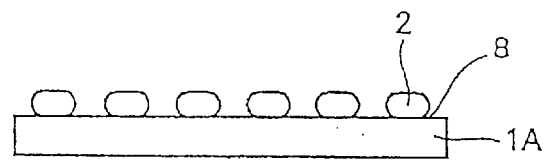

As shown in FIGS. 4(aA) and 4(aB), the insulative adhesive 7A is first provided within its corresponding adhesive forming area 1a through the use of the previously-described process step. Next, metal bumps 2 are respectively provided over AL electrode pads 8 placed over the semiconductor chip 1A as shown in FIG. 4(b). Incidentally, the metal bumps 2 may be provided over the AL electrode pads 8 before the dicing of the semiconductor wafer 15.

Figure 4C:
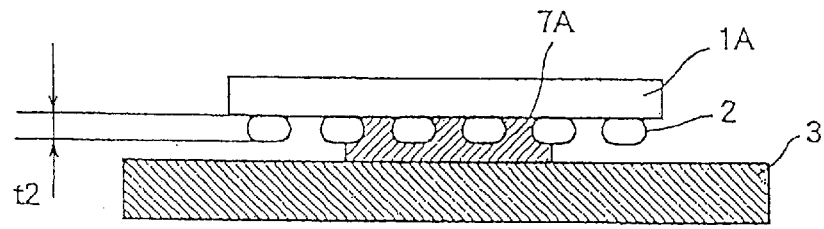

Next, as shown in FIG. 4(c), the semiconductor chip 1A with the insulative adhesive 7A and the metal bumps 2 provided thereon is flipped (turned upside down) and placed or laminated over the mother board 3 by means of the insulative adhesive 7A.

Figure 4D:
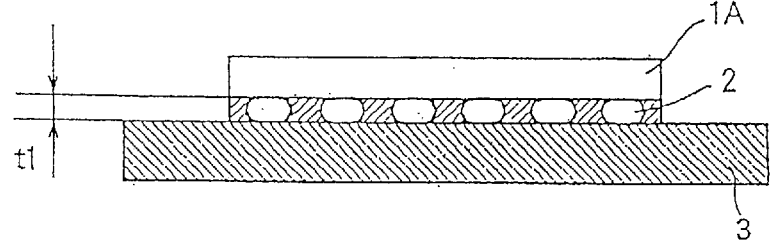

As shown in FIG. 4(d), the metal bumps 2 are bonded to a metal electrode placed over the mother board 3 by heating, and thereby the insulative adhesive 7A is melted. Some of the molten insulative adhesive 7A flows from the central portion of the semiconductor chip 1A to its peripheral portion, so that a gap defined between the semiconductor chip 1A and the mother board 3 is filled therewith. More continuous heating will cure the insulative adhesive 7A, whereby the gap defined between the semiconductor chip 1A and the mother board 3 is sealed therewith and the semiconductor chip 1A is bonded to the mother board 3.

The conventional flip-chip bonding process shown in FIGS. 11(a)–11(d) was one for injecting the liquid insulative adhesive into the gap defined between the semiconductor chip and the mother board from one side of the semiconductor chip, and causing the injected insulative adhesive to flow into the other surface of the semiconductor chip by means of a capillary phenomenon.

Figure 12A:
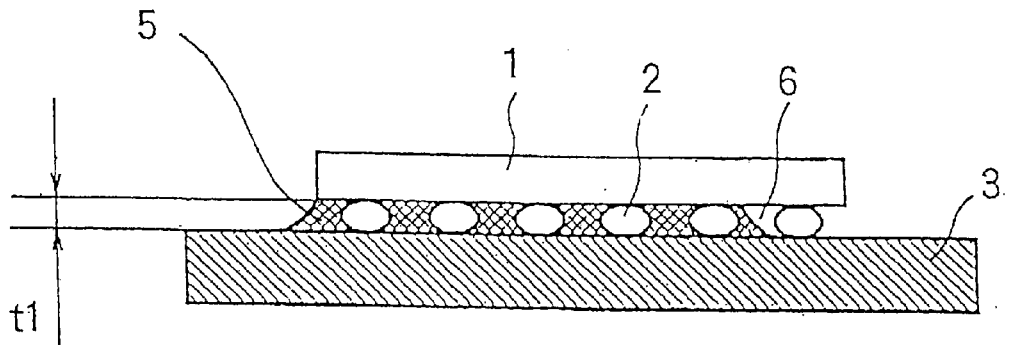
FIGS. 12(a) and 12(b) are respectively diagrams for describing a process step of FIG. 11(c).
Figure 12B:
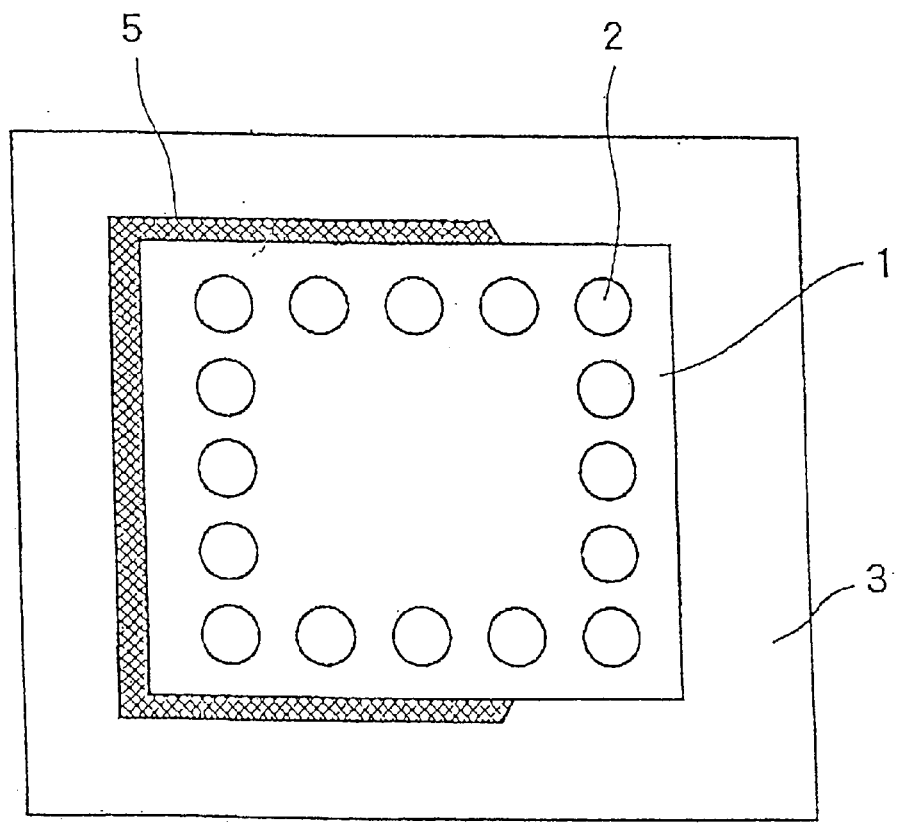

In the flip-chip bonding process according to the first embodiment shown in FIGS. 4(aA)–4(d) on the other hand, the insulative adhesive 7A is molten with being interposed in the central portion of the gap defined between the semiconductor chip 1A and the mother board 3. As a result, since the molten insulative adhesive 7A flows from the central portion of the semiconductor chip 1A to the peripheral portion of the semiconductor chip 1A, the uncharged portion (see the uncharged or non-filled portion 6 in FIG. 12(a)) can be prevented from occurring. This means that the reliability of the semiconductor device can be improved. Since a distance ti (see FIG. 4(d)) between the semiconductor chip 1A and the mother board 3 can be shortened without forming such non-filled portion, a height t2 (see FIG. 4(c)) of each metal bump 2 can be lowered. It is thus possible to implement a reduction in the thickness of the semiconductor device.

According to the first embodiment as described above, the insulative adhesives 7A can be provided within their corresponding adhesive forming areas 1a of the semiconductor elements 1 simultaneously in a lump with respect to the pre-dicing semiconductor wafer through the use of the separator 9 and the exposure mask 11. It is thus possible to shorten the time required to execute the process of providing the insulative adhesives within their corresponding adhesive forming areas of the semiconductor elements. Further, the semiconductor device can be reduced in manufacturing cost, and production yields can be improved.

Second Embodiment

Figure 5A:
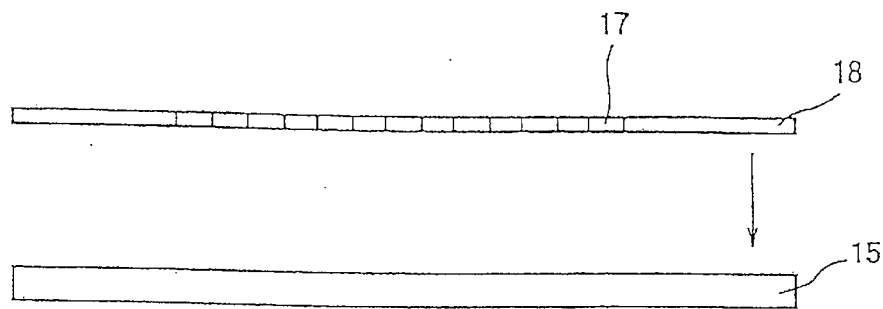
FIGS. 5(a) through 5(c) are respectively process diagrams illustrating a process for manufacturing a semiconductor device, according to a second embodiment of the present invention.
Figure 5B:
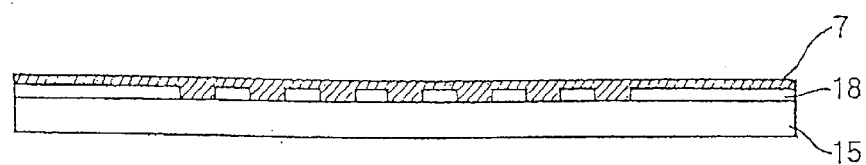
Figure 5C:
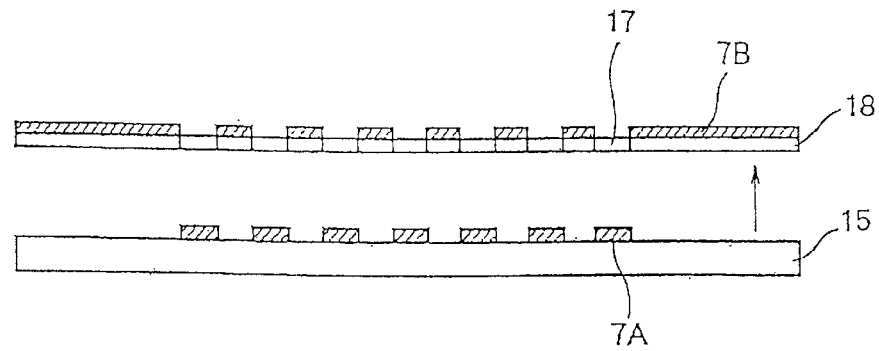

FIGS. 5(a)–5(c) are process diagrams showing a process for fabricating a semiconductor device, according to a second embodiment of the present invention. Incidentally, the same elements of structure as those shown in FIGS. 1(a)–1(f) and FIGS. 2(gA), 2(gB) and 2(h) are respectively identified by the same reference numerals in FIGS. 5(a)–5(c).

As shown in FIG. 5(a), a mask 18 (adhesive coating type) 18 with a plurality of holes 17 defined therein is first placed over the surface of a semiconductor wafer 15 already subjected to the grinding of its back (back grind). Next, as shown in FIG. 5(b), an insulative adhesive 7 is supplied onto the mask 18 (the insulative adhesive 7 is applied onto the semiconductor wafer 15 through the mask 18).

The insulative adhesive 7 used in the second embodiment contains a thermosetting component. The adhesive 7 is liquid before it is supplied (applied) and immediately after it is supplied (applied). After the adhesive 7 has been supplied (applied), it is subjected to room temperatures and thereby semi-solidified. In the second embodiment, for example, an epoxy resin is used as the insulative adhesive 7. The insulative adhesive having such a thermosetting component is semi-solidified by being subjected to the room temperatures after having been applied. When the semi-solidified insulative adhesive is heated, it is molten. After its melting, more continuous heating will cure the insulative adhesive. Incidentally, the insulative adhesive containing the UV photo-curing component may be used as in the first embodiment.

Figure 6A:
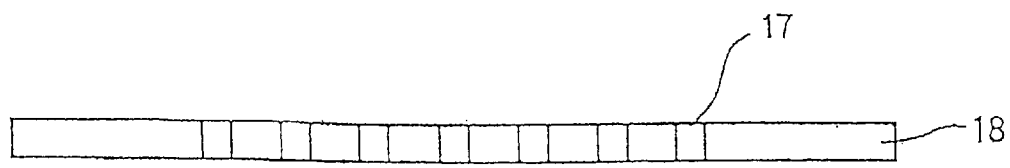
FIGS. 6(a) and 6(b) are respectively structural diagrams of a mask 18 shown in FIGS. 5(a)–5(c)
Figure 6B:
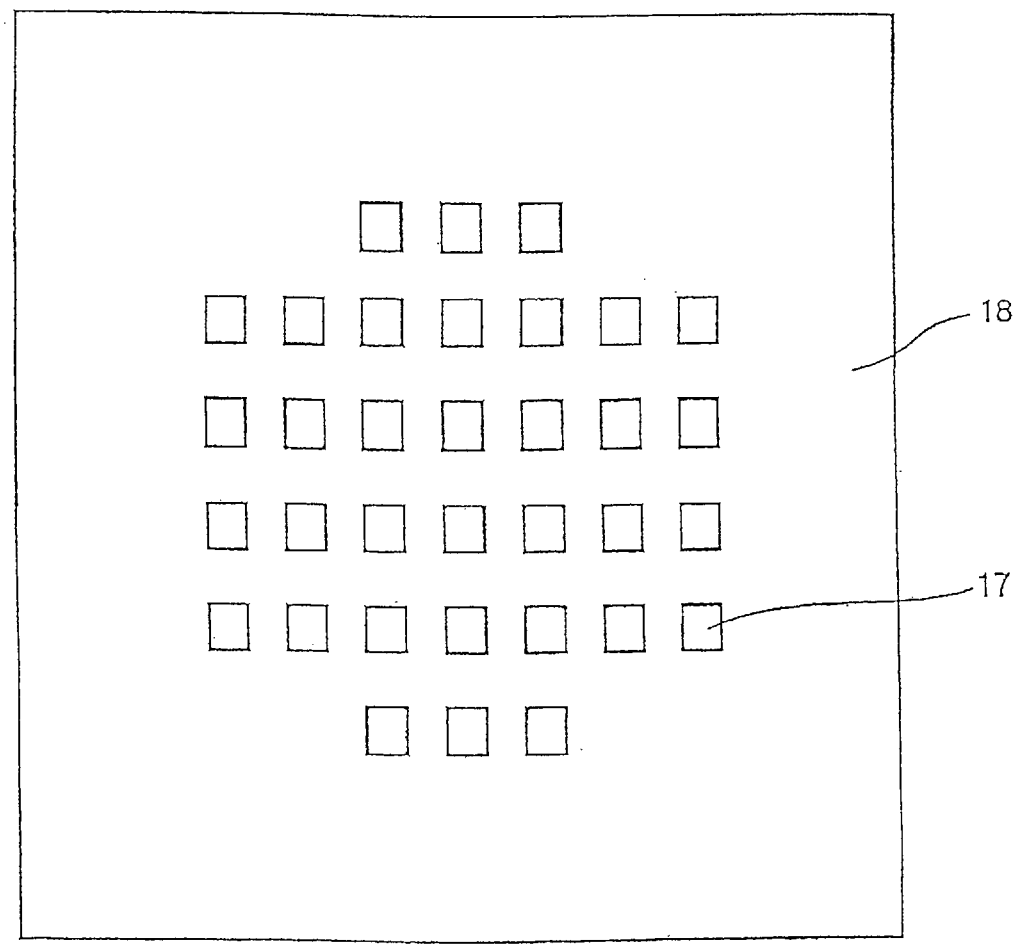

FIGS. 6(a) and 6(b) are diagrams showing the structure of the mask 18, wherein FIG. 6(a) is a side view thereof and FIG. 6(b) is a top view thereof, respectively. As shown in FIGS. 6(a) and 6(b), a plurality of holes 17 are respectively through holes defined in the mask 18, for supplying an insulative adhesive 7 to adhesive forming areas of surfaces of respective semiconductor elements built in the semiconductor wafer 15 in such a manner that they are placed over their corresponding adhesive forming areas.

Next, as shown in FIG. 5(b), the insulative adhesive 7 is supplied onto the semiconductor wafer 15 through the mask 18. Namely, the insulative adhesive 7 is supplied via the holes 17 to the adhesive forming areas alone but not supplied to an area excluding the adhesive forming areas of the surface of the semiconductor wafer 15. Thereafter, the insulative adhesive 7 is semi-solidified by being subjected to room temperatures.

Next, as shown in FIG. 5(c), the mask 18 is separated from the semiconductor wafer 15. Consequently, insulative adhesives 7B (corresponding to portions unsupplied to within the holes 17) of the insulative adhesive 7 supplied onto the mask 18 are removed from above the semiconductor wafer 15 together with the mask 18, so that only insulative adhesives 7A (corresponding to portions supplied to within the holes 17, of the insulative adhesive 7 in the second embodiment) are left in their corresponding adhesive forming areas of the semiconductor elements of the semiconductor wafer 15.

As shown in FIG. 5(c), the semiconductor wafer 15 with the insulative adhesives 7A (corresponding to the portions supplied to within the holes 17, of the insulative adhesive 7) provided in their corresponding adhesive forming areas of the respective semiconductor elements of the semiconductor wafer 15 is obtained according to the above process steps.

Thereafter, the semiconductor wafer 15 is diced into the respective semiconductor elements in the same manner as the first embodiment, whereby each of semiconductor chips having the insulative adhesives 7A provided in the adhesive forming areas is obtained. Afterwards, the semiconductor chip is flip-chip bonded to its corresponding mother board in a manner similar to the first embodiment.

Incidentally, the semiconductor elements, the adhesive forming areas and the semiconductor chip employed in the second embodiment are respectively equivalent to the semiconductor elements 1 (see FIGS. 2(gA), 2(gB), 2(h), 3(a) and 3(b)), adhesive forming areas 1a (see FIGS. 2(gA), 2(gB), 2(h), 3(a), 3(b) and 4(aA)–4(d)) and semiconductor chip 1A (see FIGS. 4(aA)–4(d)).

As shown in FIGS. 5(a) through 5(c), the second embodiment includes the following steps. Namely, the mask 18 having the plural holes 17 defined therein is placed over the surface of the semiconductor wafer 15 in such a manner that the holes 17 are located in their corresponding adhesive forming areas of the surfaces of the respective semiconductor elements built in the semiconductor wafer 15, the insulative adhesive 7 is supplied to the surface of the semiconductor wafer 15 through the mask 18, and the mask 18 is separated from the semiconductor wafer 15, whereby only the insulative adhesives 7A (corresponding to the portions supplied to within the holes 17, of the insulative adhesive 7) are collectively simultaneously left in their corresponding adhesive forming areas, and the insulative adhesives 7B (corresponding to the portions non-supplied to within the holes 17, of the insulative adhesive 7) are simultaneously removed by one operation. Consequently, the insulative adhesives 7A are selectively provided within the adhesive forming areas of the respective semiconductor elements.

In the second embodiment as described above, the insulative adhesives 7A can be provided within their corresponding adhesive forming areas of the semiconductor elements collectively and simultaneously with respect to the pre-dicing semiconductor wafer. The time required to execute the process of providing the insulative adhesives within their corresponding adhesive forming areas of the semiconductor chips can be set shorter than ever, whereby the manufacturing cost can be reduced.

Further, the second embodiment allows the simplification of the process through the use of the mask 18 as compared with the first embodiment using the separator 9 and the exposure mask 11. Thus, the time required to carry out the process for providing the insulative adhesives 7A within their corresponding forming areas of the semiconductor elements can be shortened as compared with the first embodiment, whereby the manufacturing cost can further be reduced.

Third Embodiment

In the third embodiment, the back of the semiconductor wafer 15 is ground (back-ground) with the separator 9 as a backgrind masking or protecting tape before the separator 9 is peeled from the semiconductor wafer 15 as shown in FIG. 1(f) in the first embodiment. Thus, the backgrinding of the semiconductor wafer 15 is carried out before the step shown in FIG. 1(e) in the first embodiment. In the third embodiment, however, it is carried out between the step shown in FIG. 1(e) and the step shown in FIG. 1(i).

Figure 7A:
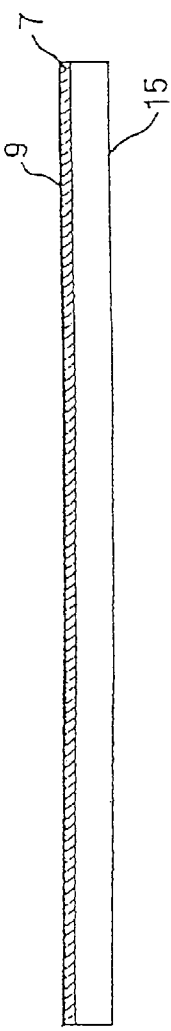
FIGS. 7(a) through 7(c) are respectively process diagrams showing a process for fabricating a semiconductor device, according to a third embodiment of the present invention.
Figure 7B:
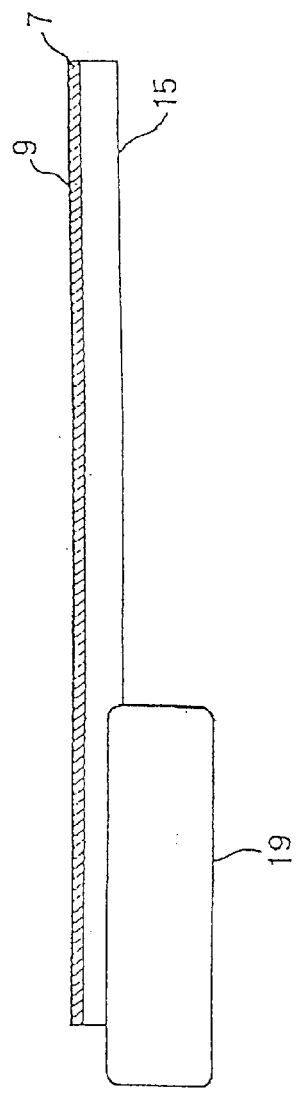
Figure 7C:
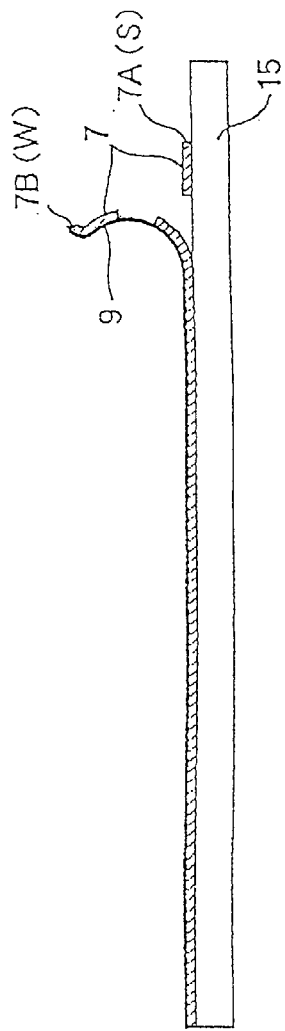

FIGS. 7(a)–7(c) are process diagrams showing a process for fabricating a semiconductor device, according to the third embodiment of the present invention. Incidentally, the same elements of structure as those shown in FIGS. 1(a)–1(f) are respectively identified by the same reference numerals in FIG. 7.

As shown in FIG. 7(a), an insulative adhesive 7 provided over a separator 9 is laminated or placed over the surface of a semiconductor wafer 15 according to the process steps shown in FIGS. 1(a) through 1(e) used in the first embodiment.

Next, as shown in FIG. 7(b), the back of the semiconductor wafer 15 is ground by a back grinder 19 with the separator 9 as the backgrind protecting or masking tape.

Next, as shown in FIG. 7(c), the separator 9 is peeled from the semiconductor wafer 15. When the separator 9 is peeled from the semiconductor wafer 15, portions W (insulative adhesives 7B) of the insulative adhesive 7 are peeled collectively and simultaneously from the semiconductor wafer 15. On the other hand, portions S (insulative adhesives 7A) of the insulative adhesive 7 are peeled collectively and simultaneously from the separator 9. Namely, the portions S are left in the adhesive forming areas respectively.

Incidentally, the subsequent process steps (corresponding to a step for dicing the semiconductor wafer into each individual semiconductor chips and a step for flip-chip bonding each semiconductor chip to a mother board) are identical to those employed in the first embodiment.

The conventional backgriding step was one for firstly placing the backgrind protecting tape over the surface of the semiconductor wafer 15 and next grinding the back of the semiconductor wafer 15.

On the other hand, in the third embodiment, the separator 9 applied onto the surface of the semiconductor wafer 15 is used as the backgrind protecting tape, and the back of the semiconductor wafer 15 is ground. Accordingly, the process step for applying the backgrind protecting tape to the surface of the semiconductor wafer becomes unnecessary. This means that the semiconductor device can be reduced in manufacturing and material costs.

Fourth Embodiment

In the fourth embodiment, the back of the semiconductor wafer 15 is ground (back-ground) with the insulative adhesive 7 as a backgrind masking or protecting tape before the mask 18 is detached from the semiconductor wafer 15 as shown in FIG. 5(c) in the second embodiment. Thus, the backgriding of the semiconductor wafer 15 is carried out before the step shown in FIG. 5(a) in the second embodiment. In the fourth embodiment, however, it is carried out between the step shown in FIG. 5(b) and the step shown in FIG. 5(c).

Figure 8A:
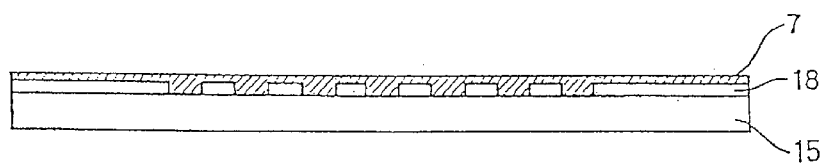
FIGS. 8(a) through 8(c) are respectively process diagrams illustrating a process for fabricating a semiconductor device, according to a fourth embodiment of the present invention.
Figure 8B:
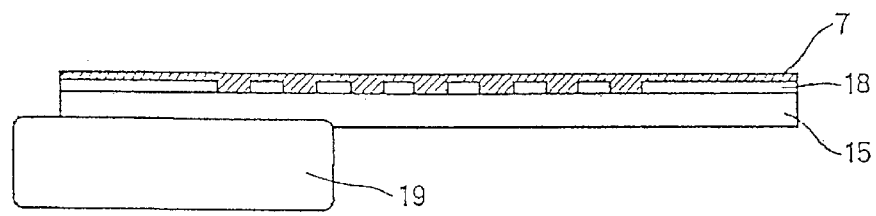
Figure 8C:
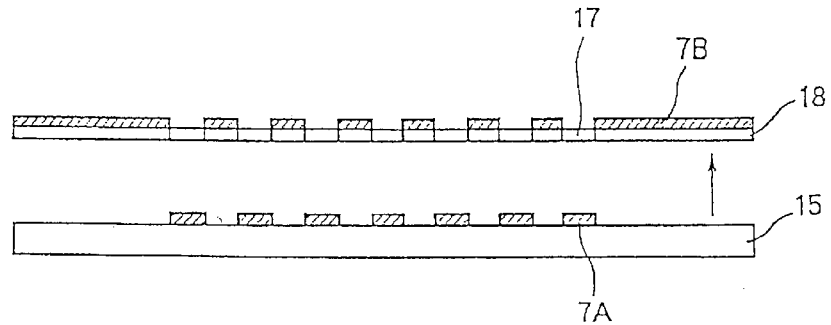

FIGS. 8(a)–8(c) are process diagrams showing a process for fabricating a semiconductor device, according to the fourth embodiment of the present invention. Incidentally, the same elements of structure as those shown in FIGS. 5(a)–5(c) are respectively identified by the same reference numerals in FIGS. 8(a)–8(c).

As shown in FIG. 8(a), an insulative adhesive 7 is supplied via a mask 18 onto a semiconductor wafer 15 according to the process steps shown in FIGS. 5(a) and 5(b) used in the second embodiment. Thereafter, the insulative adhesive 7 is semi-solidified by being subjected to room temperatures.

Next, as shown in FIG. 8(b), the back of the semiconductor wafer 15 is ground by a back grinder 19 with the insulative adhesive 7 as the backgrind protecting or masking tape.

Next, as shown in FIG. 8(c), the mask 18 is detached from the semiconductor wafer 15. Thus, insulative adhesives 7B (corresponding to portions non-supplied to within holes 17) of the insulative adhesive 7 supplied onto the mask 18 are removed from above the semiconductor wafer 15 together with the mask 18, so that only insulative adhesives 7A (corresponding to portions supplied to within the holes 17, of the insulative adhesive 7 in the fourth embodiment) are left in their corresponding adhesive forming areas of semiconductor elements of the semiconductor wafer 15.

Incidentally, the subsequent process steps (corresponding to a step for dicing the semiconductor wafer into each individual semiconductor chips and a step for flip-chip bonding each semiconductor chip to a mother board) are identical to those employed in the second embodiment.

In the fourth embodiment as described above, the insulative adhesive 7 supplied onto the surface of the semiconductor wafer 15 with the mask 18 interposed therebetween is used as the backgrind protecting tape, and the back of the semiconductor wafer 15 is ground. Accordingly, the conventional step for applying the backgrind protecting tape to the surface of the semiconductor wafer becomes unnecessary. This means that the semiconductor device can be reduced in manufacturing and material costs.

Fifth Embodiment

In the fifth embodiment, a two-chip laminated multichip is fabricated by use of a semiconductor wafer 15 obtained according to the process steps of FIGS. 1(a) through 2(gA) and FIG. 2(gB) employed in the first embodiment or the process steps of FIGS. 5(a)–5(c) employed in the second embodiment.

FIGS. 9(a)–9(f) are process diagrams showing a process for fabricating a semiconductor device, according to a fifth embodiment of the present invention. FIG. 10 is a structural diagram of an MCP (MultiChip Package) provided with the multichip according to the fifth embodiment of the present invention. The MCP is a semiconductor device equipped with two or more semiconductor chips (multichip) having a laminated structure. Incidentally, the same elements of structure as those employed in FIGS. 1(a)–1(f), 2(gA), 2(gB), 2(h), 4(aA)–4(d) and 5(a)–5(c) are respectively identified by the same reference numerals in FIGS. 9(a)–9(f) and 10.

Figure 9A:
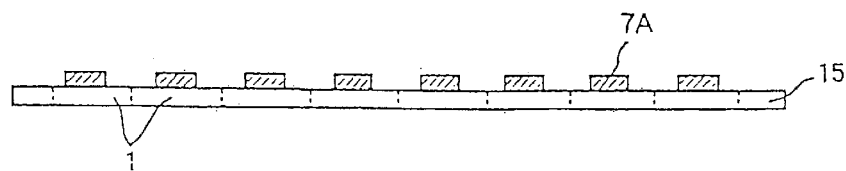
FIGS. 9(a) through 9(f) are respectively process diagrams showing a process for fabricating a semiconductor device, according to a fifth embodiment of the present invention.
Figure 10:
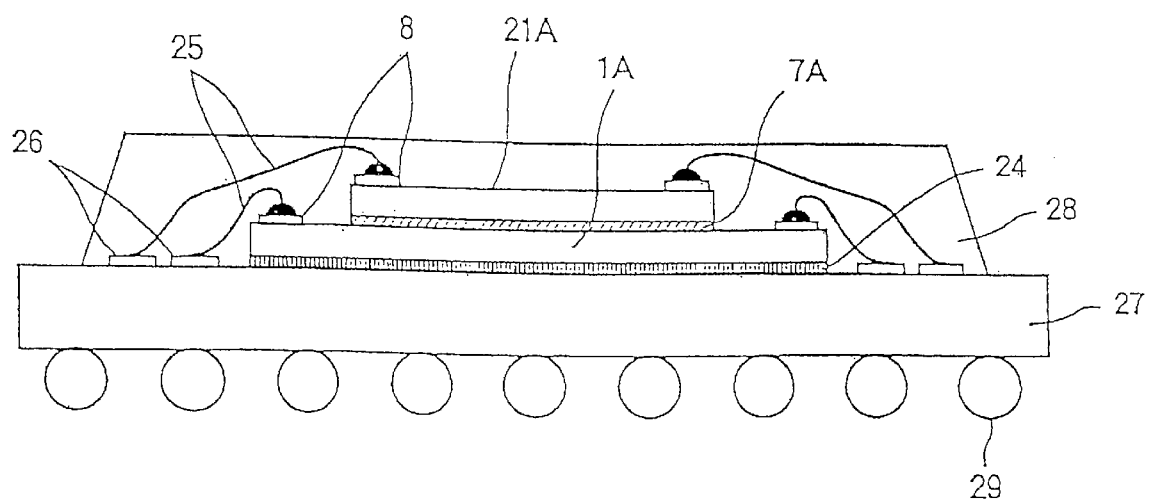
FIG. 10 is a structural diagram of a multichip package using a multichip employed in the fifth embodiment of the present invention.
Figure 11A:
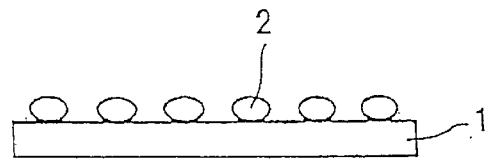
FIGS. 11(a) through 11(d) are respectively process diagrams showing a conventional process for fabricating a semiconductor device.
Figure 11B:
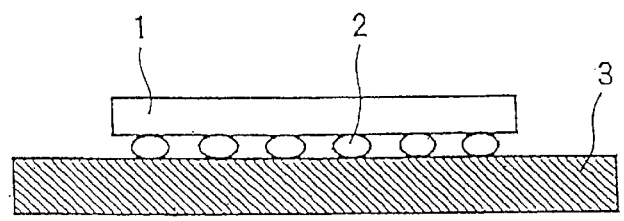
Figure 11C:
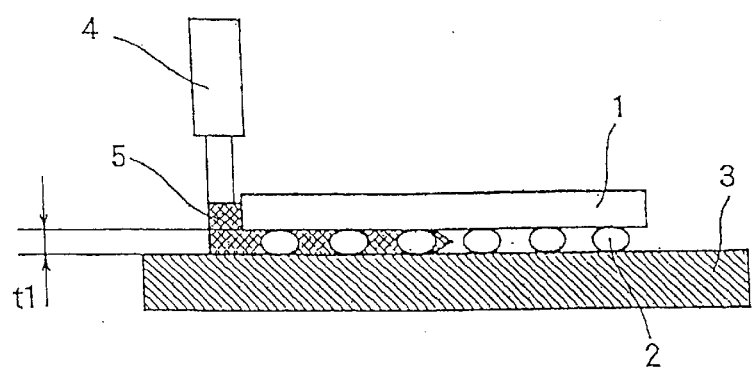
Figure 11D:
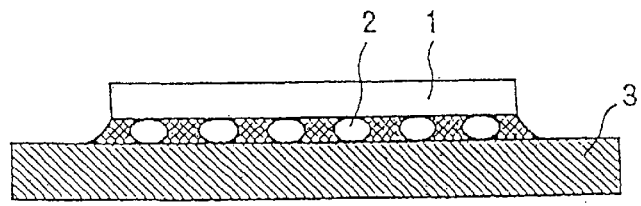

As shown in FIG. 9(a), a semiconductor wafer 15 having insulative adhesives 7A provided within their corresponding adhesive forming areas of respective semiconductor elements 1 according to the process steps of FIGS. 1(a) through 2(gA) and FIG. 2(gB) employed in the first embodiment or the process steps of FIGS. 5(a)–5(c) employed in the second embodiment is first prepared. In the following description, the semiconductor wafer 15 is used as a first semiconductor wafer, and each of semiconductor elements 1 built in the first semiconductor wafer 15 is used as a first semiconductor element.

Figure 9B:
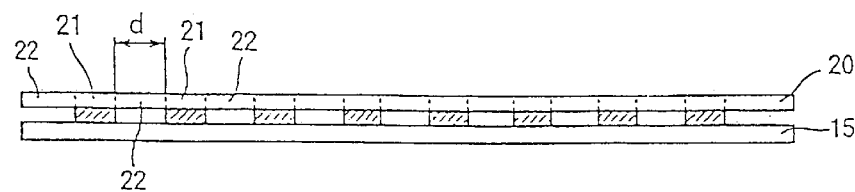

Here, the insulative adhesives 7A are provided in approximately the same size as each of second semiconductor elements 21 (see FIG. 9(b)) built in a second semiconductor wafer 20. Thus, the sizes of the adhesive forming areas 1a (see FIG. 2(gB) and FIG. 4(aB)) of the surfaces of the first semiconductor elements 1, the sizes of the UV-light shielding or masking films 12 (see FIGS. 3(a) and 3(b)) placed over the exposure mask 11, and the sizes of the holes 17 of the mask 18 are substantially identical to the sizes of the second semiconductor elements 21. As shown in FIG. 4(aA) employed in the first embodiment, each of the first semiconductor elements 1 is one wherein AL electrode pads 8 are placed on the periphery of its surface and the adhesive forming area 1a is ensured at its central portion.

Next, as shown in FIG. 9(b), the insulative adhesives 7A provided over the surface of the first semiconductor wafer 15 are laminated over the back of the second semiconductor wafer 20. Thereafter, the insulative adhesives 7A are molten by heating. More continuous heating will cure the insulative adhesive 7, whereby the backs of the second semiconductor elements 21 are bonded to their corresponding adhesive forming areas 1a of the surfaces of the first semiconductor elements 1.

Here, the plurality of second semiconductor elements 21 are made or built in the second semiconductor wafer 20 at intervals d. The second semiconductor elements 21 are located over their insulating adhesives 7A (adhesive forming areas 1a of first semiconductor elements 1). Portions 22, which do not correspond to the second semiconductor elements 21 of the second semiconductor wafer 20, are located over areas in which the insulative adhesives 7A on the surface of the first semiconductor wafer 15 are not provided. Accordingly, a gap is defined between each portion 22 of the second semiconductor wafer 20 and the first semiconductor wafer 15.

Figure 9C:
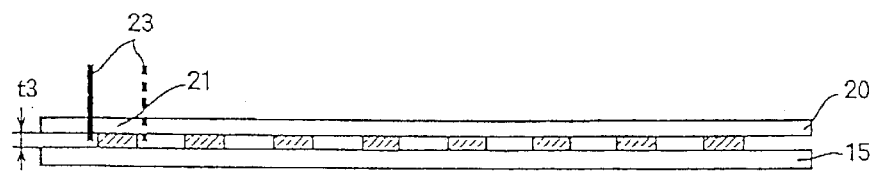
Figure 9D:
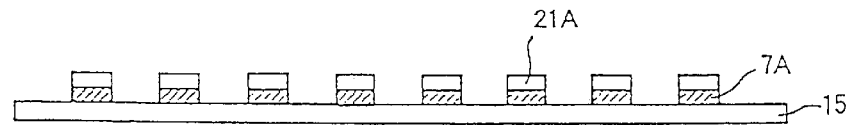

Next, as shown in FIG. 9(c), the second semiconductor wafer 20 is diced along scribe lines thereof. Thus, the second semiconductor wafer 20 is separated into second semiconductor chips 21A (corresponding to chips of second semiconductor elements 21) as shown in FIG. 9(d). At this time, a dicing blade 23 of a dicing device is deeper than the thickness of the second semiconductor wafer 20 (it reaches the back of the second semiconductor wafer 20). Further, the dicing blade 23 operates so as to stop at a position where it does not reach the surface of the first semiconductor wafer 15. Incidentally, the portions 22 lying between the adjacent semiconductor elements 21 separated by the dicing are removed.

As shown in FIG. 9(c), an interval t3 between the surface of the first semiconductor wafer 15 subsequent to the curing of the insulative adhesives 7A and the back of the second semiconductor wafer 20 may preferably be set as thin as possible to thin a multichip so as to fall within a range in which only the second semiconductor wafer 20 can reliably be diced without dicing the first semiconductor wafer 15. The desirable interval t3 is 30 [$\mu$m], for example. The thickness of each insulative adhesive 7A, and heating conditions for melting and curing the insulative adhesive 7A, etc. are established so that the interval t3 is brought to a desirable one.

Figure 9E:
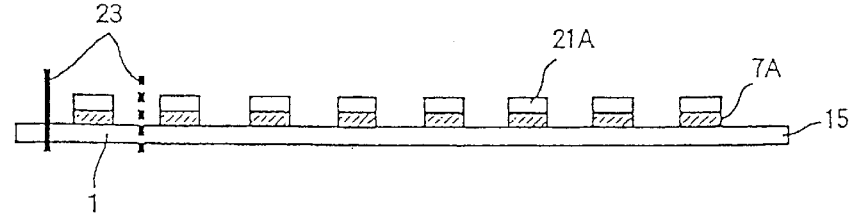

Next, as shown in FIG. 9(e), the first semiconductor wafer 15 is diced along scribe lines thereof. Thus, the first semiconductor wafer 15 is separated into each individual first semiconductor chips 1A (each corresponding to the chip of the first semiconductor element 1) as shown in FIG. 9(f).

Figure 9F:
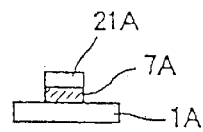

As shown in FIG. 9(f), a multichip is obtained wherein each of the second semiconductor chips 21A is laminated over it corresponding semiconductor chip 1A with the insulative adhesive 7A interposed therebetween.

Thereafter, a multichip package shown in FIG. 10 is fabricated by using the multichip shown in FIG. 9(f). For instance, an adhesive 24 is first provided over the surface of a mother board (circuit substrate or board) 27 composed of a glass epoxy resin or polyimide. Next, the back of the first semiconductor chip 1A of the multichip shown in FIG. 9(f) is bonded to the surface of the mother board 27 by means of the adhesive 24. Next, AL electrode pads 8 placed over the surface of the first semiconductor chip 1A and the surface of the second semiconductor chip 21A, and bonding posts 26 placed over the mother board 27 are bonded to one another by metal wires 25. Afterwards, the multichip and the metal wires 25 are molded by a mold resin 28. Each of solders 29 is provided for an electrode on the back of the mother board 27, which is connected to its corresponding bonding post 26 by means of a through hole or the like.

The conventional multichip fabricating process was one for firstly dicing a first semiconductor wafer into each individual first semiconductor chips, dicing a second semiconductor wafer into each individual second semiconductor chips, and next laminating the second semiconductor chips on their corresponding first semiconductor chips every individual semiconductor chips.

In the multichip manufacturing process according to the fifth embodiment on the other hand, the second semiconductor elements 21 are laminated on the first semiconductor elements 1 collectively and simultaneously in the pre-dicing semiconductor wafer units. This means that the time required to perform the multichip fabricating process can be shortened, whereby the manufacturing cost can be reduced.

According to a typical one of the present invention as described above, an advantageous effect is obtained in that since insulative adhesives can be provided within predetermined areas of a plurality of semiconductor elements collectively and simultaneously with respect to a semiconductor wafer antecedent to the dicing thereof into each individual semiconductor chips, the time necessary for a process for fabricating a semiconductor device can be shortened, whereby a reduction in manufacturing cost and an improvement in production yield can be achieved.

While the preferred form of the present invention has been described, it is to be understood that modifications will be apparent to those skilled in the art without departing from the spirit of the invention. The scope of the invention is to be determined solely by the following claims.

What is claimed is:

1. A method of fabricating a semiconductor device, comprising:
    preparing a semiconductor wafer with a plurality of semiconductor elements formed thereon;
    selectively providing an insulating adhesive over respective predetermined areas of the semiconductor elements; and
    dividing the semiconductor wafer into the semiconductor elements,
    wherein the insulating adhesive has a property that an adhesion strength thereof is reduced upon exposure to ultraviolet rays, said selectively providing an insulating adhesive comprises
    preparing a separator,
    providing the insulating adhesive over the separator,
    applying the ultraviolet rays to areas of the insulating adhesive,
    placing the separator over a surface of the semiconductor wafer so that the areas of the insulating adhesive do not contact the predetermined areas of the semiconductor elements, and
    peeling the separator from the semiconductor wafer to thereby cause the insulating adhesive located in the predetermined areas to remain on the semiconductor elements.

2. The method according to claim 1, further including grinding a back of the semiconductor wafer having the separator placed thereon.

3. The method according to claim 1, further including:
    preparing a circuit substrate,
    contacting the insulating adhesive of the semiconductor elements divided from the semiconductor wafer to the circuit substrate, and
    melting the insulating adhesive and thereby filling the insulating adhesive between the semiconductor elements and the circuit substrate.

4. A method of fabricating a semiconductor device, comprising:
    preparing a semiconductor wafer with a plurality of semiconductor elements formed thereon;
    selectively providing an insulating adhesive over respective predetermined areas of the semiconductor elements; and
    dividing the semiconductor wafer into the semiconductor elements, wherein said preparing a semiconductor wafer further comprises preparing a second semiconductor wafer having a plurality of second semiconductor elements formed thereon, the method further comprising contacting the insulating adhesive of the semiconductor elements to the second semiconductor elements respectively, and melting the insulating adhesive to thereby bond the semiconductor wafer and the second semiconductor wafer to one another, wherein said dividing the semiconductor wafer includes dividing the bonded semiconductor wafer and second semiconductor wafer.

5. The method according to claim 4, wherein said providing an insulating adhesive comprises:

preparing a mask having a plurality of through holes defined therein, placing the mask over a surface of the semiconductor wafer so that the through holes are placed over the predetermined areas of the semiconductor elements, providing the insulating adhesive in the through holes defined in the mask, and peeling the mask from the semiconductor wafer to thereby cause the insulating adhesive located in the predetermined areas to remain on the semiconductor elements.

6. The method according to claim 5, further including grinding a back of the semiconductor wafer having the mask placed thereon.

7. The method according to claim 4, wherein said dividing comprises dividing the bonded semiconductor wafer and second semiconductor wafer along dicing lines that are not covered by the insulating adhesive.

8. The method according to claim 4, wherein said dividing comprises:

dicing the second semiconductor wafer along first dicing lines and removing portions of the second semiconductor water not adhered to the insulating adhesive; and dicing the semiconductor wafer along second dicing lines to provide the semiconductor elements, after said dicing the second semiconductor wafer.

9. The method according to claim 8, wherein intervals between the first dicing lines are different than intervals between the second dicing lines.

10. The method according to claim 8, wherein the first and second dicing lines are not covered by the insulating adhesive.

11. The method according to claim 4, wherein the semiconductor elements and the plurality of second semiconductor elements are semiconductor chips.

12. A method of fabricating a semiconductor device, comprising:

preparing a semiconductor wafer having a plurality of semiconductor elements formed on a first surface thereof;

providing an insulating adhesive on an entirety of the first surface including the semiconductor elements;

polishing a second surface of the semiconductor wafer after said providing an insulating adhesive, the second surface being opposite the first surface;

removing the insulating adhesive from the first surface of the semiconductor wafer, except for areas of the first surface where the semiconductor elements are formed, after said polishing; and dividing the semiconductor wafer into the semiconductor elements after said removing.

13. The method according to claim 12, wherein the insulating adhesive has a property that an adhesion strength thereof is reduced upon exposure to ultraviolet rays, wherein said providing an insulating adhesive comprises:

preparing a separator;

providing the insulating adhesive over the separator;

applying the ultraviolet rays to areas of the insulating adhesive; and placing the separator over the first surface of the semiconductor wafer so that the areas of the insulating adhesive do not contact the areas of the first surface of the semiconductor wafer where the semiconductor elements are formed, whereby the insulating adhesive remains at the areas of the first surface of the semiconductor wafer after said removing.

14. The method according to claim 13, wherein said polishing comprises grinding the second surface of the semiconductor wafer.

15. The method according to claim 13, further comprising:

preparing a circuit substrate, causing the insulating adhesive of the divided semiconductor elements to contact the circuit substrate, and melting the insulating adhesive and thereby charging the insulating adhesive between the semiconductor elements and the circuit substrate.

16. The method according to claim 12, wherein said preparing a semiconductor wafer further comprises preparing a second semiconductor wafer having a plurality of second semiconductor elements formed thereon, the method further comprising causing the insulating adhesive of the semiconductor elements to contact the second semiconductor elements respectively, and melting the insulating adhesive to thereby bond the semiconductor wafer and the second semiconductor wafer to one another, wherein said dividing comprises dividing the bonded semiconductor wafer and second semiconductor wafer.

* * * * *